US011257933B2

(12) United States Patent
Yin et al.

(10) Patent No.: US 11,257,933 B2
(45) Date of Patent: Feb. 22, 2022

(54) SEMICONDUCTOR DEVICE AND METHOD FOR MANUFACTURING THE SAME

(71) Applicant: Institute of Microelectronics, Chinese Academy of Sciences, Beijing (CN)

(72) Inventors: Huaxiang Yin, Beijing (CN); Qingzhu Zhang, Beijing (CN); Renren Xu, Beijing (CN)

(73) Assignee: Institute of Microelectronics, Chinese Academy, Beijing (CN)

( * ) Notice: Subject to any disclaimer, the term of this patent is extended or adjusted under 35 U.S.C. 154(b) by 0 days.

(21) Appl. No.: 17/029,495

(22) Filed: Sep. 23, 2020

(65) Prior Publication Data

US 2021/0193822 A1 Jun. 24, 2021

Related U.S. Application Data

(63) Continuation of application No. PCT/CN2020/071943, filed on Jan. 14, 2020.

(30) Foreign Application Priority Data

Dec. 19, 2019 (CN) .......................... 201911317194.7

(51) Int. Cl.
*H01L 29/66* (2006.01)
*H01L 27/092* (2006.01)
(Continued)

(52) U.S. Cl.
CPC .................. *H01L 29/66795* (2013.01); *H01L 21/823821* (2013.01); *H01L 21/823871* (2013.01);
(Continued)

(58) Field of Classification Search
CPC ............... H01L 29/0673; H01L 29/775; H01L 29/42392; H01L 29/78696;
(Continued)

(56) References Cited

U.S. PATENT DOCUMENTS

2012/0288995 A1* 11/2012 El-Ghoroury ....... H01L 33/0093
438/107
2013/0270512 A1* 10/2013 Radosavljevic .... H01L 21/8258
257/9

(Continued)

*Primary Examiner* — Tong-Ho Kim
(74) *Attorney, Agent, or Firm* — Goodwin Procter LLP

(57) ABSTRACT

A method for manufacturing a semiconductor device is provided. A first substrate and at least one second substrate are provided. A single crystal lamination structure is formed on the first substrate. The single crystal lamination structure includes at least one hetero-material layer and at least one channel material layer that are alternately laminated, each of the at least one hetero-material layer is bonded to an adjacent one of the at least one channel material layer at a side away from the first substrate, and each of the at least one channel material layer is formed from one of the at least one second substrate. At least one layer of nanowire or nanosheet is formed from the single crystal lamination structure. A gate dielectric layer and a gate which surround each of the at least one layer of nanowire or nanosheet is formed. A semiconductor device is also provided.

20 Claims, 24 Drawing Sheets

(51) Int. Cl.
*H01L 29/786* (2006.01)
*H01L 29/423* (2006.01)
*H01L 21/8238* (2006.01)

(52) U.S. Cl.
CPC .. *H01L 21/823878* (2013.01); *H01L 27/0924* (2013.01); *H01L 29/42392* (2013.01); *H01L 29/78696* (2013.01)

(58) Field of Classification Search
CPC ............ H01L 29/66795; H01L 27/092; H01L 27/0924; H01L 21/823807; H01L 21/823842; H01L 21/823871; H01L 21/823878; H01L 21/823821
USPC ......................................................... 257/369
See application file for complete search history.

(56) References Cited

U.S. PATENT DOCUMENTS

| | | | |
|---|---|---|---|
| 2017/0040209 A1* | 2/2017 | Wang | H01L 21/31105 |
| 2018/0331073 A1* | 11/2018 | Sekar | H01L 23/5225 |
| 2021/0082686 A1* | 3/2021 | Chiang | H01L 21/0245 |

* cited by examiner

SEMICONDUCTOR DEVICE AND METHOD FOR MANUFACTURING THE SAME

This application is a continuation of International Application No. PCT/CN2020/071943, titled "SEMICONDUCTOR DEVICE AND METHOD FOR MANUFACTURING THE SAME", titled on Jan. 14, 2020, which claims the priority of the priority to Chinese Patent Application No. 201911317194.7, titled "SEMICONDUCTOR DEVICE AND METHOD FOR MANUFACTURING THE SAME" filed on Dec. 19, 2019 with the China National Intellectual Property Administration, both of which are incorporated herein by reference in their entireties.

FIELD

The present disclosure relates to the field of semiconductor technology, and in particular to a semiconductor device and a method for manufacturing a semiconductor device.

BACKGROUND

As the integrated circuit (IC) continually shrinks in critical size, especially for the manufacture technology lower than 5 nm node, conventional triple-gate or double-gate Fin Field-Effect Transistors (FinFETs) cannot meet the basic requirement for continual shrinking of the integrated circuit clue to serious short-channel effect in device's operation as well as a performance degradation of transistor. In order to solve above problem, gate-all-around (GAA) structure for transistor and IC continual shrinking have been adopted. The GAA structure is constructed on a laminated nanowire or nanosheet channel of transistor, to ensure that the gates can be located on a top and both sides of a channel and is also located under the channel.

In a conventional laminated nanowire or nanosheet gate-all-around device, the channel is generally formed from multilayer Si/SiGe superlattice on Si substrate through periodic epitaxy with a STI first process. Alternatively, the channel may be formed by forming Si/SiGe superlattice through periodic epitaxy with a STI last process.

However, with the channel forming methods mentioned above, the lattice defects may be caused easily in the formed channel of transistor, which affects the performance and the reliability of finally formed semiconductor devices and ICs.

SUMMARY

In order to overcome the technical issues that the lattice defect introduced easily into a laminated nanowire or nanosheet channel with the conventional channel fabrication method, which greatly affects the performance and the reliability of a final device, a semiconductor device and a method for manufacturing a semiconductor device are provided according to the present disclosure.

The method for manufacturing a semiconductor device according to the present disclosure includes:
providing a first substrate and a second substrate, where the first substrate has a first bonding surface, and the second substrate has a second bonding surface;
forming a single crystal lamination structure on the first substrate, where the single crystal lamination structure includes multiple hetero-material layers and multiple channel material layers that are alternately laminated;
forming multiple layers of nanowires or nanosheets on the first substrate;
forming a gate dielectric layer and a gate that surround the multiple layers of nanowires or nanosheets;
forming a metal contact;
forming multiple layers of interconnection structures on a structure formed after forming the metal contact; and
sequentially forming a metal pad and a passivation layer on the multiple layers of interconnection structures.

In an embodiment, the forming the single crystal lamination structure on the first substrate includes:
forming a hetero-material layer on the first bonding surface of the first substrate;
bonding the hetero-material layer on the first substrate to the second bonding surface of the second substrate;
thinning the second substrate from a side away from the second bonding surface, to form a channel material layer having a predetermined thickness on the hetero-material layer; and
repeatedly performing the above steps to form, on the first substrate, the single crystal lamination structure including the multiple hetero-material layers and the multiple channel material layers that are alternately laminated.

In an embodiment, each of the first substrate and the second substrate is any one of a Si substrate, a SOI substrate, a GOI substrate and a SiGe substrate.

In an embodiment, the hetero-material layer is made of $SiO_2$, $SiN_X$ or SiC. A thickness of the hetero-material layer ranges from 1 nm to 100 nm and a value of x ranges from 0.1 to 0.9.

In an embodiment, the channel material layer is made of Si, Ge or Site, and a thickness of the channel material layer ranges from 1 nm to 100 nm.

In an embodiment, the hetero-material layer is bonded to the second bonding surface through silicon-to-silicon direct bonding, metal surface bonding, polymer adhesive layer bonding or eutectic bonding process.

In an embodiment, each layer of an interconnection structure includes a third oxide dielectric layer, a through hole formed by etching the third oxide dielectric layer, a second metal plug filled in the through hole and a metal line connected to the second metal plug.

In an embodiment, the forming multiple layers of nanowires or nanosheets on the first substrate includes:
etching the single crystal lamination structure and the first substrate to form multiple fin structures extending along a first direction on the first substrate, where the multiple fin structures includes multiple hetero-material etching structures and multiple second substrate etching structures that are alternately laminated and a first substrate etching structure;
forming a shallow trench isolation in a trench between adjacent fin structures;
forming a sacrificial gate extending along a second direction on the multiple fin structures;
forming source-or-drain regions through doping and thermal annealing;
depositing a first oxide dielectric layer on a structure formed through thermal annealing, and planarizing the first oxide dielectric layer to expose a top of the sacrificial gate; and
removing the sacrificial gate, and removing the hetero-material etching structure in a gate region to form the multiple layers of nanowires or nanosheets.

In an embodiment, after forming the sacrificial gate and before the doping, the method further includes:
selectively removing the multiple fin structures at two sides of the sacrificial gate by a predetermined length, and forming inner sidewalls on two sides of the sacrificial gate along the first direction;

forming spacers on the sacrificial gate, the inner sidewalls and the multiple fin structures remaining after performing the above step; and forming multiple fins extending along a first direction on a side of the spacer, where the multiple fins respectively corresponds to the multiple fin structures.

In an embodiment, each of the multiple fins includes first material layers and second material layers that are alternately laminated. Each of the first material layers is made of Si, and each of the second material layers is made of SiGe.

In an embodiment, the semiconductor device is a laminated nanowire or nanosheet gate-all-around NMOS device or a laminated nanowire or nanosheet gate-all-around PMOS gate device.

In an embodiment, the semiconductor device is a laminated nanowire or nanosheet CMOS gate-all-around gate device, and the first substrate includes an N-type-well region and a P-type-well region.

In an embodiment, the forming a gate dielectric layer and a gate on each of the multiple layers of nanowires or nanosheets includes:

forming a gate dielectric layer on each of the multiple layers of nanowires or nanosheets, and sequentially forming a first metal layer, a second metal layer and a first metal gate layer on the gate dielectric layer in each of the N-type-well region and the P-type-well region;

selectively removing the first metal gate layer and the second metal layer formed on the gate dielectric layer in the P-type-well region, and selectively removing the first metal layer in the P-type-well region by a predetermined thickness;

selectively removing the first metal gate layer in the N-type-well region by a predetermined thickness, and forming a second metal gate layer on each of the first metal gate layer remaining in the N-type-well region and the first metal layer remaining in the P-type-well region;

forming a third metal layer on the second metal gate layer in each of the N-type-well region and the P-type-well region; and depositing a first metal on a gate region, and planarizing the first metal.

In an embodiment, the forming the metal contact includes:

depositing a second oxide dielectric layer, and planarizing the second oxide dielectric layer;

etching the second oxide dielectric layer to form contact holes running downward from a top surface of the second oxide dielectric layer, where the contact holes correspond to the source-or-drain regions;

forming silicide at a bottom of the contact holes, where the silicide contacts the source-or-drain regions;

filling the contact holes with a second metal to form a first metal plug; and depositing a fourth metal layer, and forming a metal contact based on the fourth metal layer.

In an embodiment, the first metal layer is made of TiN, and a thickness of the first metal layer ranges from 0.1 nm to 5 nm. The second metal layer is made of TaN, and a thickness of the second metal layer ranges from 0.1 nm to 5 nm. The first metal gate layer is made of TiN or TiSiN and a thickness of the first metal gate layer ranges from 0.1 nm to 10 mn.

In an embodiment, the second metal gate layer is made of TiAlCy, and a thickness of the second metal gate layer ranges from 0.1 nm to 10 nm, where a value of y ranges from 0.1 to 0.9. The third metal layer is made of anyone of W, Co and Al or any combination thereof, and a thickness of the third metal layer ranges from 1 nm to 500 nm. The first metal is W.

In an embodiment, the silicide is any one of NiSi, TiSi2 and CoSi2. A thickness of the silicide ranges from 0.1 nm to 100 nm. The second metal is Co or W.

A semiconductor device is further provided according to the present disclosure. The semiconductor device is manufactured by the method for manufacturing a semiconductor device according to the present disclosure.

In view of the above, with the method for manufacturing a semiconductor device according to the present disclosure, a single crystal lamination structure including multiple hetero-material layers and multiple channel material layers that are alternately laminated is formed by forming the multiple hetero-material layers and bonding each of the multiple hetero-material layers to a corresponding channel material layer. Compared with a conventional lamination structure formed through epitaxial growth, a lattice defect in a channel can be avoided in the single crystal lamination structure, thereby ensuring a performance and a reliability of a subsequently formed semiconductor device.

The semiconductor device according to the present disclosure has the same high performance, high reliability and good applicability.

Figure 1:
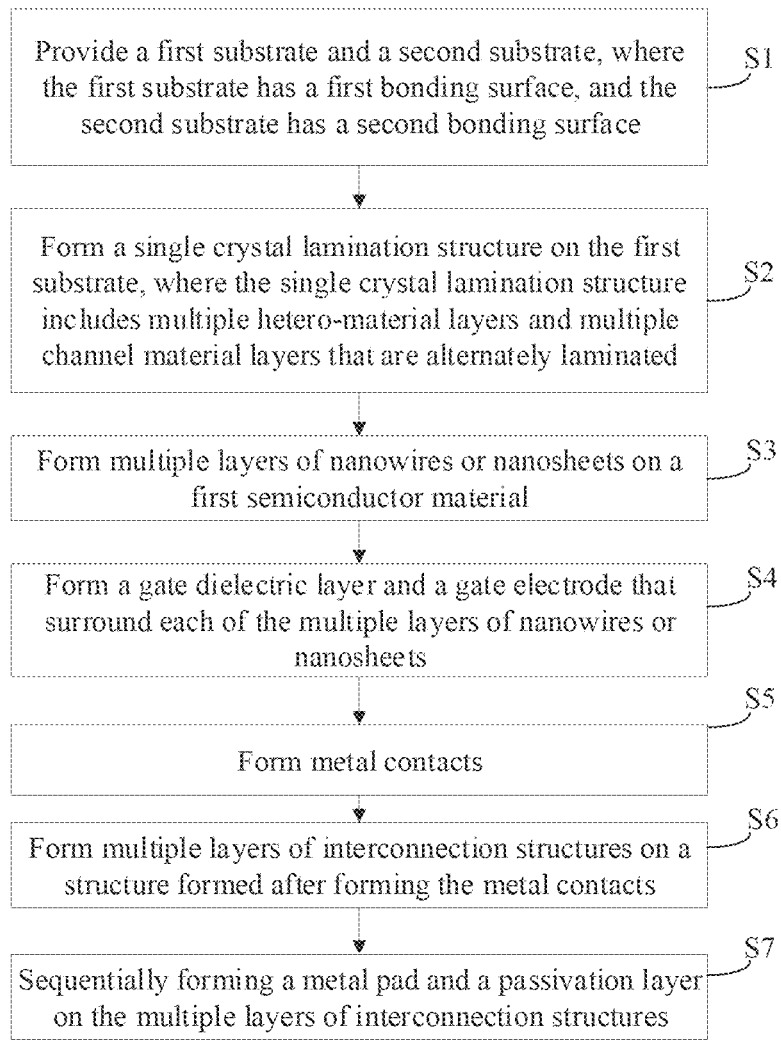
FIG. 1 is a flowchart of a method for manufacturing a semiconductor device according to the present disclosure.

| Reference numerals in the drawings are listed as follows. | |
|---|---|
| 1 first substrate | 2 N-type-well region |
| 3 P-type-well region | 4 first bonding surface |
| 5 second substrate | 6 second bonding surface |
| 7 single crystal lamination structure | 8 hetero-material layer |
| 9 channel material layer | 10 fin structure |
| 11 first substrate etching structure | 12 hetero-material etching structure |
| 13 second substrate etching structure | 14 shallow trench isolation |
| 15 sacrificial gate | 16 filling cavity |
| 17 inner sklewall | 18 spacer |
| 19 fin | 20 first material layer |
| 21 second material layer | 22 first oxide dielectric layer |
| 23 nanowire or nanosheet | 24 gate dielectric layer |
| 25 first metal layer | 26 second metal layer |
| 27 first metal gate layer | 28 second metal gate layer |
| 29 third metal layer | 30 first metal |
| 31 second oxide dielectric layer | 32 contact hole |
| 33 fifth metal layer | 34 silicide |
| 35 first metal plug | 36 fourth metal layer |
| 37 metal contact | 38 third oxide dielectric layer |
| 39 through hole | 40 second metal plug |
| 41 metal line | 47 metal pad |
| 43 passivation layer | |

DETAILED DESCRIPTION OF EMBODIMENTS

Embodiments of the present disclosure are described below in conjunction with the drawings.

Numerous specific details are set forth in following descriptions to facilitate the full understanding of the present disclosure. However, the present disclosure may also be implemented in other embodiments than embodiments described herein. Therefore, the present disclosure is not limited to the embodiments described hereinafter.

As the integrated circuit continually shrinks in critical size, especially for the manufacture technology lower than 5 nm node, a conventional triple-gate or double-gate FinFET device cannot meet the basic requirement for continual shrinking of the integrated circuit due to a structure of the conventional triple-gate or double-gate Fin Field-Effect Transistor device. In order to solve above problem, a GAA structure may be adopted. The GAA structure may be used to adjust a size of a laminated nanowire or nanosheet gate-all-around device, to ensure that the gates can be located on a top and both sides of a channel and is also arranged under the channel.

A channel in a conventional laminated nanowire or nanosheet gate-all-around device is generally formed with the following two methods.

The channel in a conventional laminated nanowire or nanosheet gate-all-around device is formed through epitaxy by using a STI-first process. Specifically, a substrate is etched to form multiple fin structures on the substrate. A shallow trench isolation is formed by deposition. The shallow trench isolation is etched to expose a top of each of the multiple fin structures. The multiple fin structures are etched to form multiple grooves. Then, a fin meeting a requirement for materials is formed through epitaxy on each groove, and a channel is formed based on the fin. With the method for forming a channel through epitaxy, since two sides of the groove cannot adequately limit a growth of lattices of a channel material, and materials of the substrate and the fins are different from each other or materials of various parts of the fin are different from each other, there may be difference in atomic structure, thus a lattice defect may be caused in a finally obtained channel.

Alternatively, the channel in a conventional laminated nanowire or nanosheet gate-all-around device may be formed through periodical epitaxy by using a STI-last process. Specifically a Si/SiGe lamination is formed through periodical epitaxy on a substrate. Next, multiple fin structures are formed by etching the lamination and the substrate, and a channel is formed based on the multiple fin structures. With the method for forming the Si/SiGe lamination through periodical epitaxy, on one hand, a lattice defect may be caused in the obtained lamination due to above reasons, and on the other hand, a process of forming a shallow trench isolation in a semiconductor device and a process of performing an activation process on source-or-drain regions in the semiconductor device are required to be performed at a high temperature greater than 800° C., while external expansions of Ge atoms may be caused under such a high temperature in SiGe of the Si/SiGe lamination which is formed in a previous process, resulting in a degraded material characteristics and affecting a subsequent process. Therefore, after the Si/SiGe lamination is formed, a low temperature lower than 800° C. is generally adopted to prevent external expansions of the Ge atoms. However, the low temperature is unfavorable for subsequent processes of forming a high-quality shallow trench isolation and source-or-drain regions, which may further result in a poor performance of a manufactured semiconductor device.

In order to overcome the technical issue in which a lattice defect is caused easily in a formed channel with the conventional channel forming method, which affects a performance and a reliability of a finally formed device or the technical issue that a process for forming a subsequent structure is limited due to characteristic of materials, a semiconductor device and a method for manufacturing a semiconductor device are provided according to the present disclosure. Cores of the present disclosure are described as follows.

A single crystal lamination structure including multiple hetero-material layers and multiple channel material layers that are alternately laminated is formed by forming the multiple hetero-material layers and bonding each of the multiple hetero-material layers to a corresponding channel material layer, such that a lattice defect is not caused in a manufactured structure due to epitaxial growth, thereby avoiding an effect on a performance and a reliability of a subsequently formed device. In addition, with the manufacturing method, it is unnecessary to form a laminated nanowire gate-all-around gate device by forming multiple layers of Si/SiGe lamination through periodical epitaxy, such that no limit is caused to a process for forming a subsequent structure, thereby realizing a good applicability.

Figure 2:
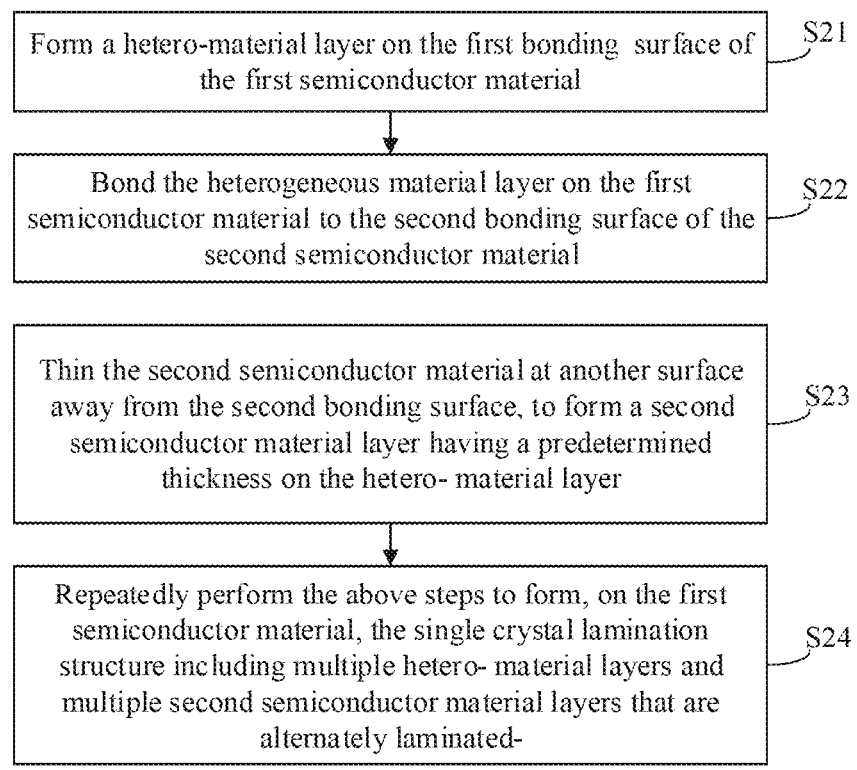
FIG. 2 is a flowchart of a process of forming a single crystal lamination structure on a first substrate according to the present disclosure.

The method for manufacturing a semiconductor device according to the present disclosure, as shown in FIG. 1 and FIG. 2, includes the following steps S1 to S7.

Figure 3:
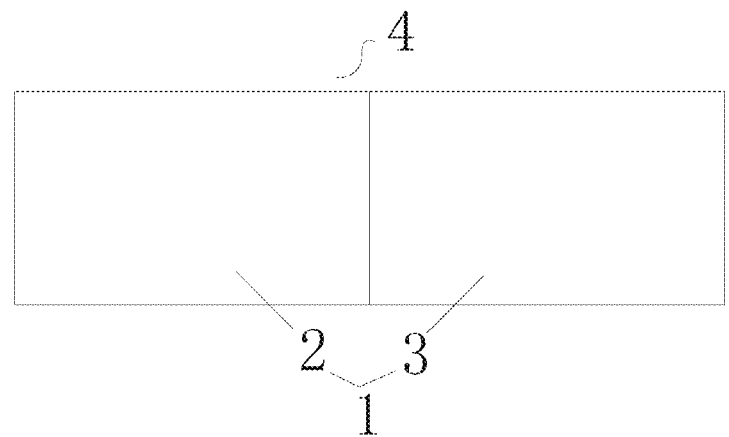
FIG. 3 to FIG. 28 are diagrams each showing a structure corresponding to each step of the method for manufacturing a semiconductor device according to the present disclosure.
Figure 5:
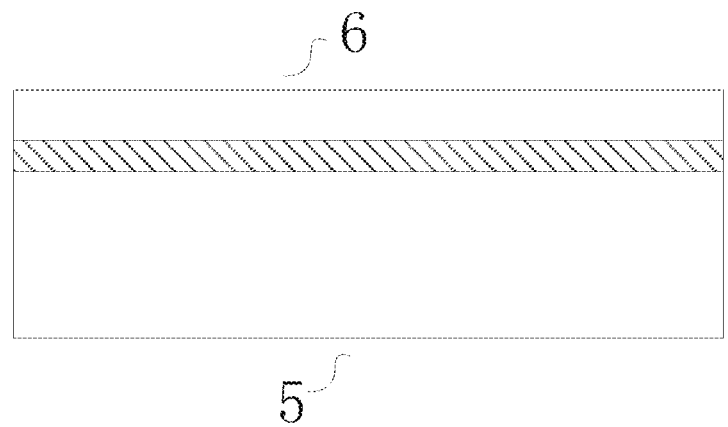

In step S1, as shown in FIG. 3 and FIG. 5, a first substrate 1 and a second substrate 5 are provided. The first substrate 1 has a first bonding surface 4, and the second substrate 5 has a second bonding surface 6.

In step S1, the first substrate 1 includes a semiconductor material on which a single crystal lamination structure 7 is subsequently formed. The first bonding surface 4 is a surface of the first substrate 1. Specifically, the first bonding surface 4 is a surface on which a hetero-material layer 8 is subsequently formed, which is bonded to the second bonding surface 6. The second substrate 5 includes a channel material for subsequently forming the semiconductor device (that is, a channel material layer 9). The second bonding surface 6 is a surface of the second substrate 5. Specifically, the second bonding surface 6 is a surface of the second substrate 5 which is subsequently bonded to the first bonding surface 4.

Specifically, each of the first substrate 1 and the second substrate 5 is any one of a Si substrate, a SOI substrate, a GOI substrate and a SiGe substrate. However, each of the first substrate 1 and the second substrate 5 may be made of other semiconductor materials meeting requirements.

In an embodiment, the first substrate 1 is preferably a Si substrate, and the second substrate 5 is preferably a SOI substrate.

Exemplary, as shown in FIG. 5, in a case that the second substrate 5 is a SOI substrate, the SOI substrate includes a silicon layer, a buried oxide layer and a silicon substrate in the listed sequence from top to bottom. The second bonding surface 6 is a surface of the silicon layer away from the buried oxide layer.

It is to be noted that, a semiconductor device manufactured with the method may be a laminated nanowire or nanosheet gate-all-around NMOS device, a laminated nanowire or nanosheet gate-all-around PMOS device, or a laminated nanowire or nanosheet gate-all-around CMOS device.

Specifically, in a case that the semiconductor device is a laminated nanowire or nanosheet gate-all-around NMOS device, the first substrate 1 includes a P-type-well region 3.

In a case that the semiconductor device is a laminated nanowire or nanosheet gate-all-around PMOS device, the first substrate 1 includes an N-type-well region 2.

As shown in FIG. 3, in a case that the semiconductor device is a laminated nanowire or nanosheet gate-all-around CMOS device, the first substrate 1 includes an N-type-well region 2 and a P-type-well region 3.

In step S2, as shown in FIG. 4 to FIG. 9, a single crystal lamination structure 7 is formed on the first substrate 1. The single crystal lamination structure 7 includes multiple hetero-material layers 8 and multiple channel material layers 9 that are alternately laminated.

In step S2, the number of the hetero-material layers S and the channel material layers 9 in the single crystal lamination structure 7 may be determined according to actual needs, which is not limited herein.

Exemplary, in a case that the single crystal lamination structure 7 includes two hetero-material layers 8 and two channel material layers 9 that are alternately laminated, two layers of nanowires or nanosheets 23 are formed accordingly.

Specifically, the forming the single crystal lamination structure 7 on the first substrate 1 includes the following steps S21 to S24.

Figure 4:
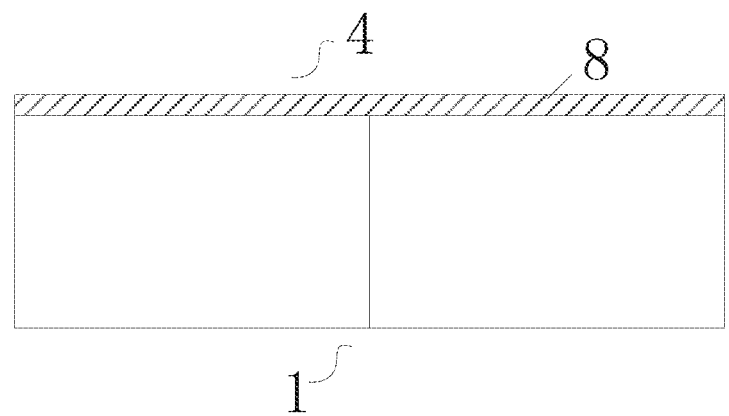

In step S21, as shown in FIG. 4, a hetero-material layer 8 is formed on the first bonding surface 4 of the first substrate 1.

In step S21, before bonding, it is required to form the hetero-material layer 8 on the first bonding surface 4 of the first substrate 1. The hetero-material layer 8 may be made of $SiO_2$, $SiN_x$ or SiC. A value of x ranges from 0.1 to 0.9.

Specifically, a thickness of the hetero-material layer 8 ranges from 1 nm to 100 nm.

Exemplary, in a case that the first substrate 1 is a Si substrate and the hetero-material layer 8 is made of $SiO_2$, the first substrate 1 may be oxidized at the first bonding surface 4 to form the hetero-material layer 8 on the first substrate 1. In a case that the hetero-material layer 8 is made of $SiN_x$ or SiC, the hetero-material layer 8 may be formed on the first bonding surface 4 of the first substrate 1 by a process such as a chemical vapor deposition (CVD), a physical vapor deposition (PVD), evaporation or an atomic layer deposition (ALD).

Figure 6:
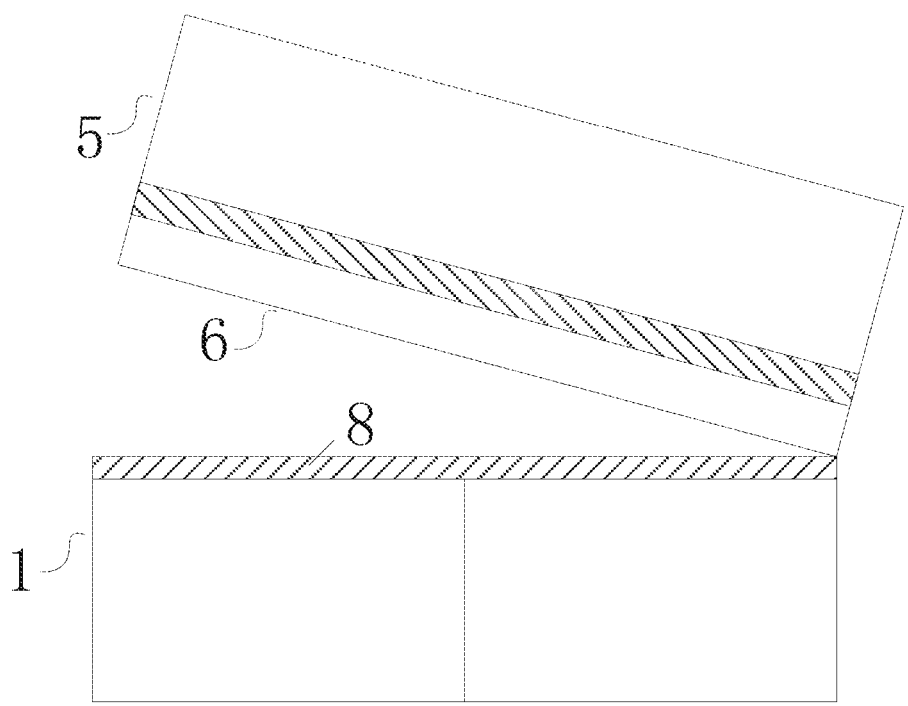
Figure 7:
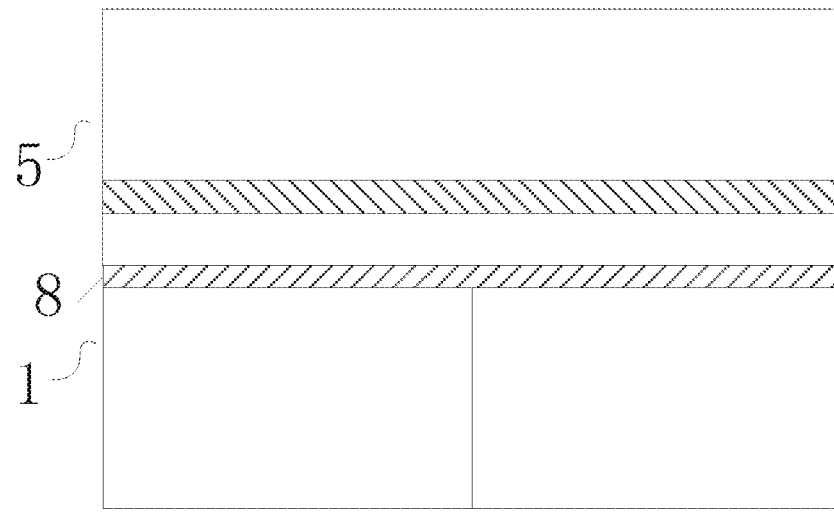

In step S22, as shown in FIG. 6 and FIG. 7, the hetero-material layer 8 on the first substrate 1 is bonded to the second bonding surface 6 of the second substrate 5.

In step S22, after the hetero-material layer 8 is formed, the first substrate 1 is placed upside down and is arranged on the first bonding surface 4 of the second substrate 5 through the hetero-material layer 8, and the hetero-material layer 8 is bonded to the first bonding surface 4, such that the hetero-material layer 8 is tightly bonded to the first bonding surface 4.

Specifically, the hetero-material layer 8 may be bonded to the second bonding surface 6 through silicon-to-silicon direct bonding, metal surface bonding, polymer adhesive layer bonding or eutectic bonding process.

Figure 8:
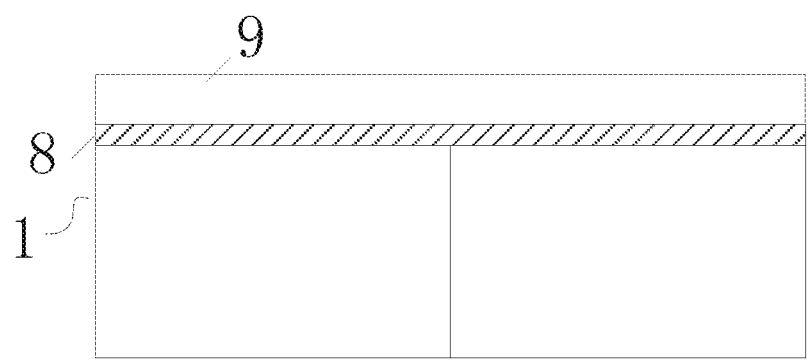

In step S23, as shown in FIG. 8, the second substrate 5 is thinned from another side away from the second bonding surface 6, to form a channel material layer 9 having a predetermined thickness on the hetero-material layer 8.

In step S23, after bonding, it is required to thinning the second substrate 5 at the another surface to form the channel material layer 9 meeting a requirement in thickness on the hetero-material layer 8.

The channel material layer 9 is made of any one of Si, Ge and SiGe, and a thickness of the channel material layer 9 ranges from 1 nm to 100 nm.

Figure 9:
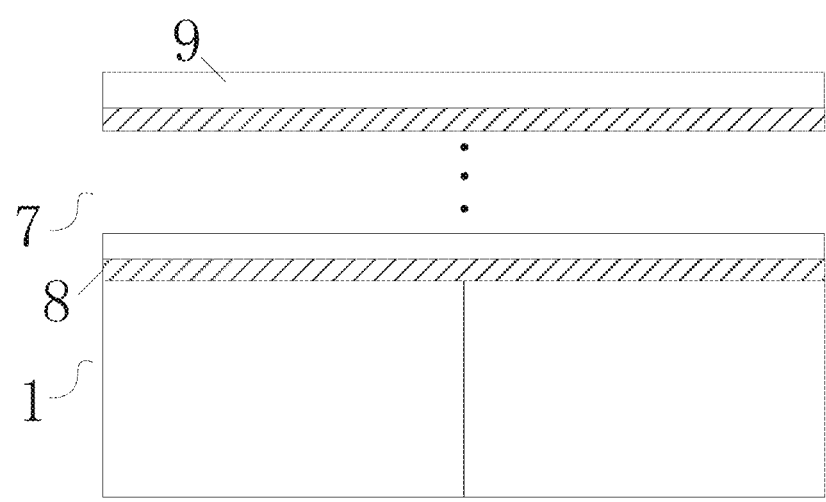

In step S24, as shown in FIG. 9, the above steps S21 to S23 are repeatedly performed to form, on the first substrate 1, the single crystal lamination structure 7 including multiple hetero-material layers 8 and multiple channel material layers 9 that are alternately laminated.

In step S24, after the channel material layer 9 is formed, another hetero-material layer 8 is formed on the channel material layer 9 at a side away from the hetero-material layer 8 formed in step S21, for forming a second lamination. Another second substrate 5 is provided, and processes such as bonding and thinning are sequentially performed to obtain the second lamination. The above steps are repeatedly performed to obtain the single crystal lamination structure 7 including multiple hetero-material layers 8 and multiple channel material layers 9.

Exemplary, in a case that the first substrate 1 is a Si substrate, the hetero-material layer 8 is made of $SiO_2$, and the second substrate 5 is a SOI substrate, a single crystal lamination structure 7 including multiple layers of $SiO_2$/Si lamination may be obtained after performing the above steps.

Compared with the conventional method for forming a channel through epitaxy, with the manufacturing method in the above technical solution, the single crystal lamination structure 7 is formed through oxidation or surface deposition in a layer-by-layer bonding manner, such that a lattice defect in a formed channel is not caused by an inadequate limitation surrounding a channel material for epitaxy growth or differences between a channel material, a substrate material and a sacrificial layer material, thereby improving a performance and a reliability of a finally formed device. In addition, with the formed lamination including multiple hetero-material layers 8 and the channel material layers 9, atomic diffusion affecting characteristics of the channel material is not caused under a high temperature, and a subsequent process is not affected.

It is to be noted that, a thickness of a hetero-material layer 8 in each lamination may be the same as or different from that in another lamination, and a thickness of a channel material layer 9 in each lamination may be the same as or different from that in another lamination. Specifically, a thickness of a hetero-material layer 8 and a thickness of a channel material layer 9 may be determined according to actual needs.

In step S3, as shown in FIG. 10 to FIG. 19, multiple layers of nanowires or nanosheets 23 are formed on the first substrate 1.

Specifically, the forming the multiple layers of nanowires or nanosheets 23 on the first substrate 1 includes the following steps S31 to S36.

Figure 10:
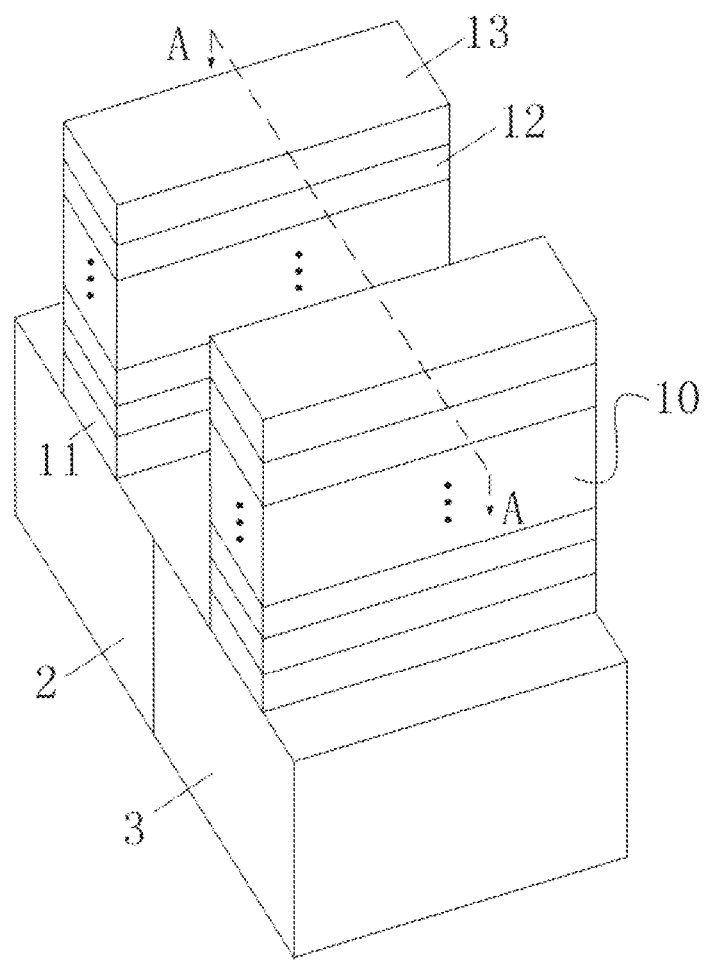
Figure 11:
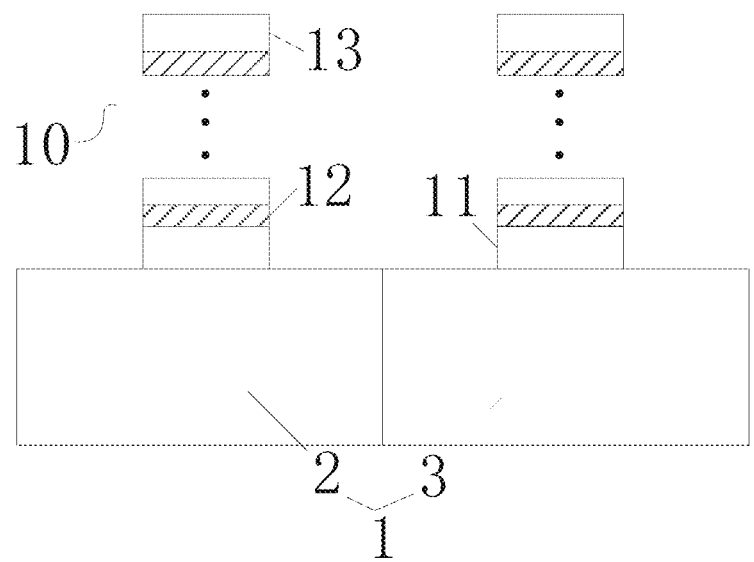

In step S31, as shown in FIG. 10 and FIG. 11, the single crystal lamination structure 7 and the first substrate 1 are etched to form multiple fin structures 10 extending along a first direction on the first substrate 1. Each of the multiple fin structures 10 includes multiple hetero-material etching structures 12 and multiple second substrate etching structures 13 that are alternately laminated and a first substrate etching structure 11.

In step S31, the single crystal lamination structure 7 and the first substrate 1 may be etched through an anisotropic dry etching process, to form the multiple fin structures 10 extending along the first direction on the first substrate 1. Each of the multiple fin structures 10 includes multiple hetero-material etching structures 12 and multiple second substrate etching structures 13 that are alternately laminated and the first substrate etching structure 11. Specifically, the first substrate etching structure 11 is formed by etching the first substrate 1. Each of the multiple hetero-material etching structures 12 is formed by etching a corresponding hetero-material layer 8. Each of the multiple second substrate etching structures 13 is formed by etching a corresponding channel material layer 9.

It is to be noted that, FIG. 10 is a perspective view of a structure obtained after forming the multiple fin structures 10. FIG. 11 is a cross-sectional view of the structure shown in FIG. 10 along a line A-A.

Figure 12:
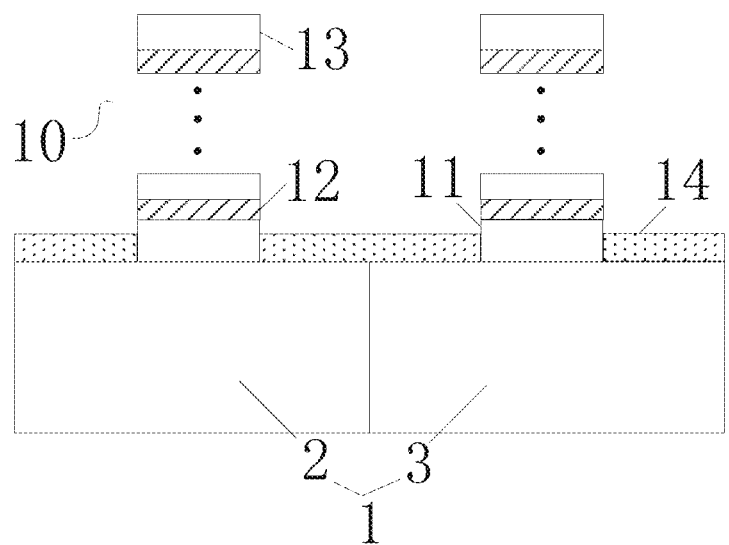

In step S32, as shown in FIG. 12, a shallow trench isolation 14 is formed in a trench between adjacent fin structures 10.

In step S32, compared with a conventional method for forming a laminated nanowire or nanosheet gate-all-around device through periodical epitaxy based on Si/SiGe lamination, with the method according to the present disclosure, the shallow trench isolation 14 with a high-quality can be formed under a high temperatures, such that characteristics of the channel material is not degraded due to that Ge atoms are diffused into other regions under the high temperature, and a subsequent process is not affected, thereby improving a performance of a device.

A material of the shallow trench isolations 14 may be SiN, $Si_3N_4$, $SiO_2$ or SiCO. A thickness of the shallow trench isolation 14 may be determined according to actual needs.

Figure 13:
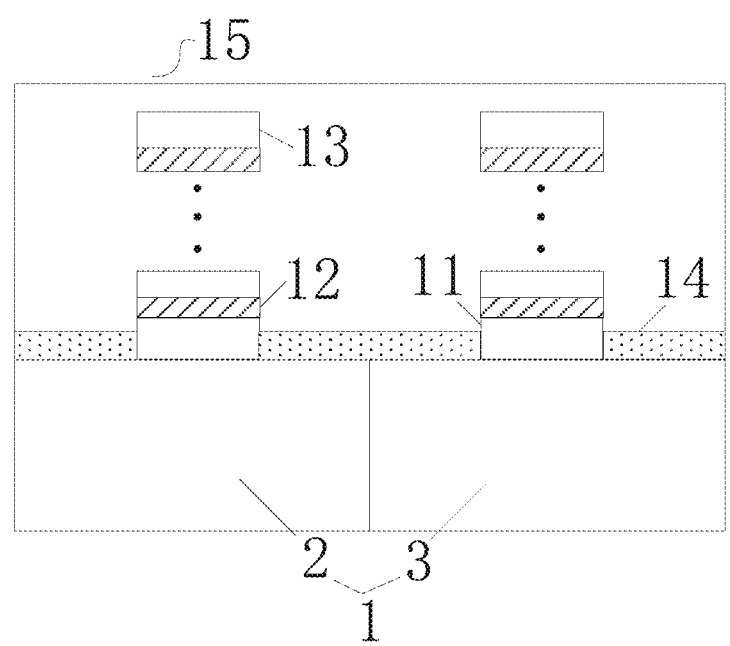

In step S33, as shown in FIG. 13, a sacrificial gate 15 extending along a second direction is formed on the multiple fin structures 10.

In step S33, a gate material of the sacrificial gate 15 is formed on the multiple fin structures 10. The gate material may be polysilicon. Then the gate material is etched through wet etching or dry etching process to form the sacrificial gate 15.

It is to be noted that, FIG. 12 is a cross-sectional view of a structure obtained after forming the shallow trench isolation 14 along the line A-A. FIG. 13 is a cross-sectional view of a structure obtained after forming the sacrificial gate 15 along the line A-A.

Further, after performing step S33 and before performing step S34, the method may further include the following steps S33-1 to S33-3.

In step S33-1, the multiple fin structures 10 at two sides of the sacrificial gate 15 are selectively removed by a predetermined length, and inner sidewalls 17 are formed on two sides of the sacrificial gate 15 along the first direction.

Figure 14:
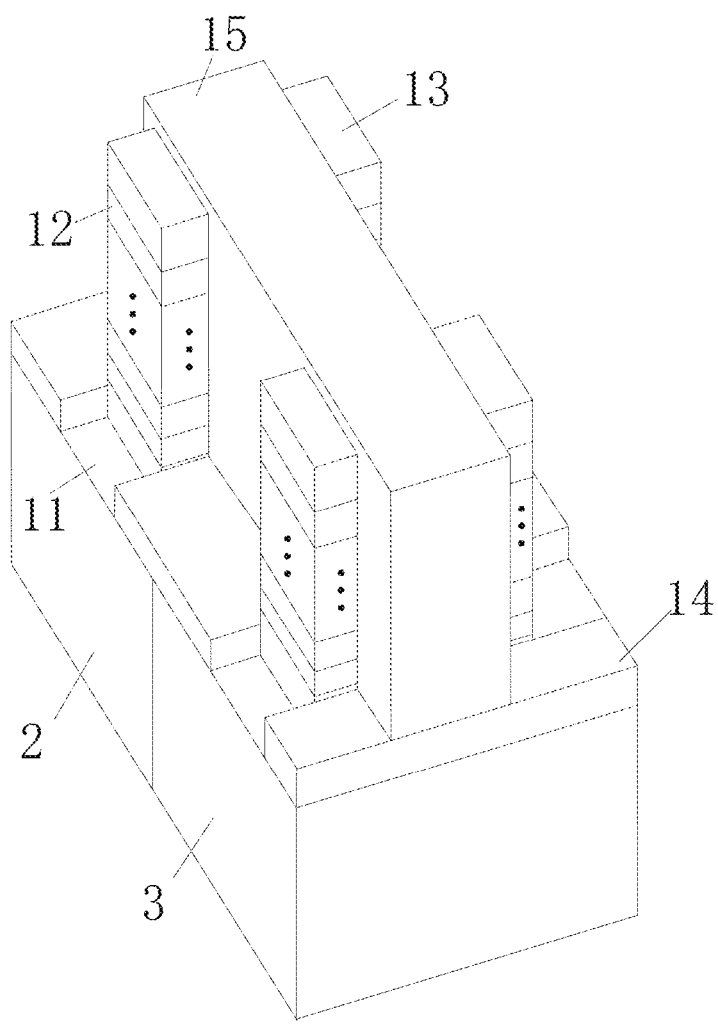
Figure 15:
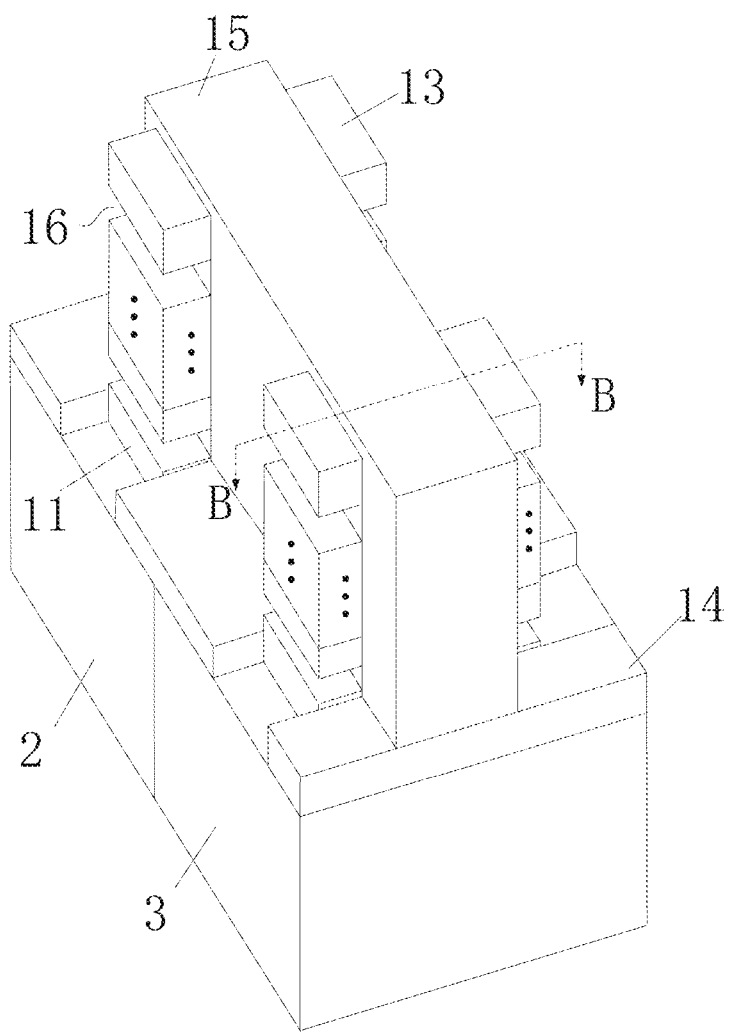
Figure 16:
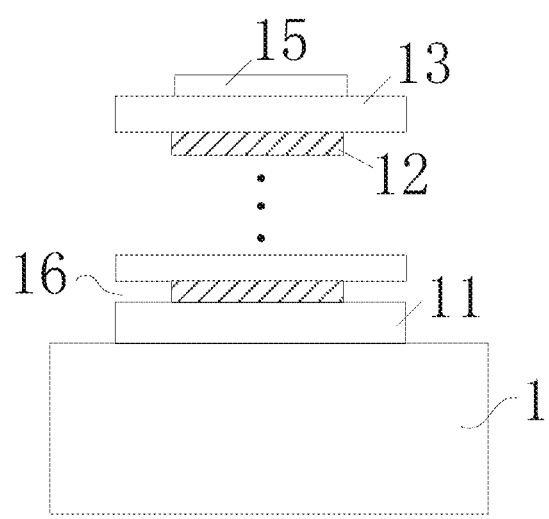

In step S33-1, as shown in FIG. 14, after source-or-drain regions in the fin structure 10 is selectively removed, the hetero-material etching structure 12 remaining in the fin structure 10 is selectively removed by a certain length through wet etching or dry etching process. Specifically, as shown in FIG. 15 and FIG. 16, a part of the hetero-material etching structure 12 that is exposed outside the sacrificial gate 15 may be removed to form a filling cavity 16. Then, a covering material is formed on the remaining fin structure 10 through a process such as an ALD process, and a part of the covering material that is located outside the filling cavity 16 is removed in a high selectivity ratio, such that the covering material is arranged within the filling cavity 16.

It is to be noted that, it is required to form the covering material with a material having a different selectivity ratio from that of the hetero-material etching structure 12.

FIG. 14 is a perspective view of a structure obtained after removing the source-or-drain regions. FIG. 15 is a perspective view of a structure obtained after forming the filling cavity 16. FIG. 16 is a cross-sectional view of the structure shown in FIG. 15 along a line B-B.

In step S33-2, spacers 18 are formed on the sacrificial gate 15, the inner sidewalls 17 and the remaining fin structures 10.

It is to be noted that, after the spacers 18 are formed on the remaining fin structure 10, both sides of the remaining fin structure 10 along the first direction are required to be exposed, to facilitate subsequently forming a fin 19 attached to each side of the remaining fin structure 10.

Figure 17:
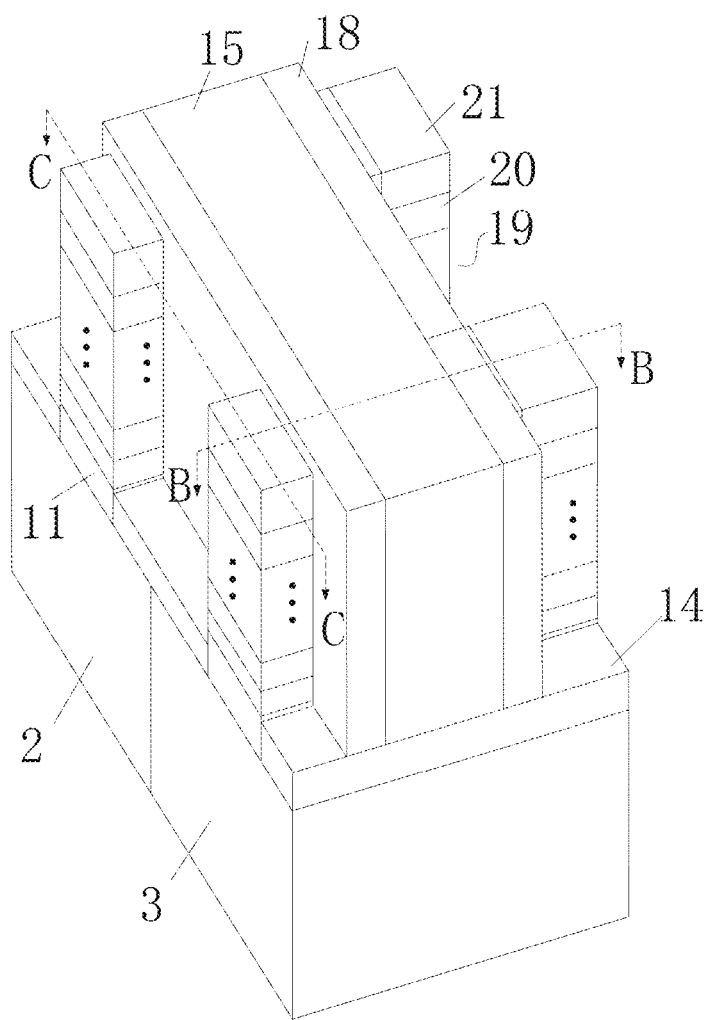
Figure 18:
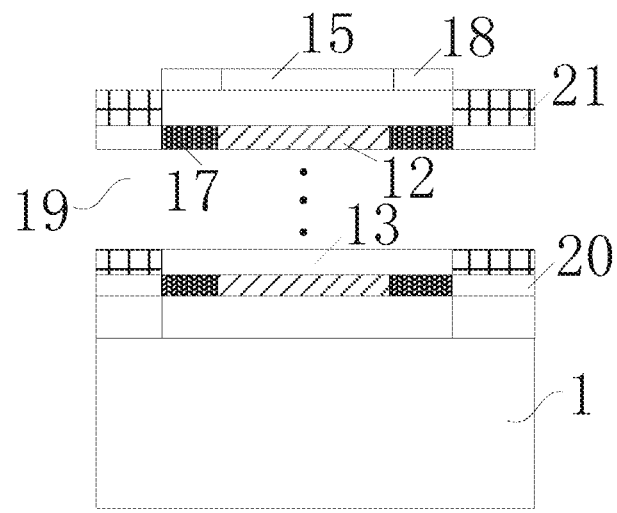

In step S33-3, as shown in FIG. 17 and FIG. 18, multiple fins 19 extending along the first direction are formed on a side of each spacer 18. The multiple fins 19 correspond to the remaining fin structures 10.

In step S33-3, after the spacers 18 are formed, it is required to form the fins 19 at a position at which a part of the fin structure 10 is removed through epitaxy, to subsequently form source-or-drain regions on the fins 19 through a process such as doping or ion injection process.

Specifically, the fins 19 include first material layers 20 and second material layers 21 that are alternately laminated. The first material layer 20 may be made of Si, and the second material layer 21 may be made of SiGe. However, the first material layer 20 and the second material layer 21 may be made of other materials meeting requirements.

It is to be noted that, FIG. 17 is a perspective view of a structure obtained after forming the fins 19. FIG. 18 is a cross-sectional view of the structure shown in FIG. 17 along the line B-B.

In step S34, source-or-drain regions are formed through doping and thermal annealing.

In step S34, the fin 19 formed at two sides of the sacrificial gate 15 is doped, and then the thermal annealing is performed to form and activate the source-or-drain regions. However, in a conventional method for forming a channel region in a laminated nanowire or nanosheet gate-all-around gate device by forming Si/SiGe lamination through periodical epitaxy, in order to prevent Ge atoms from diffusing, a low-temperature lower than 800° C. is generally used, which is unfavorable for forming high-quality source-or-drain regions.

With the method according to the present disclosure, a channel region in a laminated nanowire or nanosheet gate-all-around gate device is formed in the manner of lamination structures such as a $SiO_2$/Si lamination structure, a $SiO_2$/Ge lamination structure and a $SiO_2$/SiGe lamination structure. In this way, after the source-or-drain region are formed, thermal annealing may be performed on the source-or-drain regions, such that the above problem can be prevented, thereby improving a performance of a manufactured device.

In step S35, a first oxide dielectric layer 22 is deposited on a structure formed by the above steps, and the first oxide dielectric layer 22 is planarized to expose a top of the sacrificial gate 15.

In step S35, a first oxide dielectric layer 22 is deposited on the formed structure. The first oxide dielectric layer 22 may be made of $SiO_2$. The first oxide dielectric layer 22 is required to have a thickness for embedding the protruding sacrificial gate 15. After the first oxide dielectric layer 22 is deposited, the first oxide dielectric layer 22 is planarized to expose the top of the sacrificial gate 15.

Figure 19:
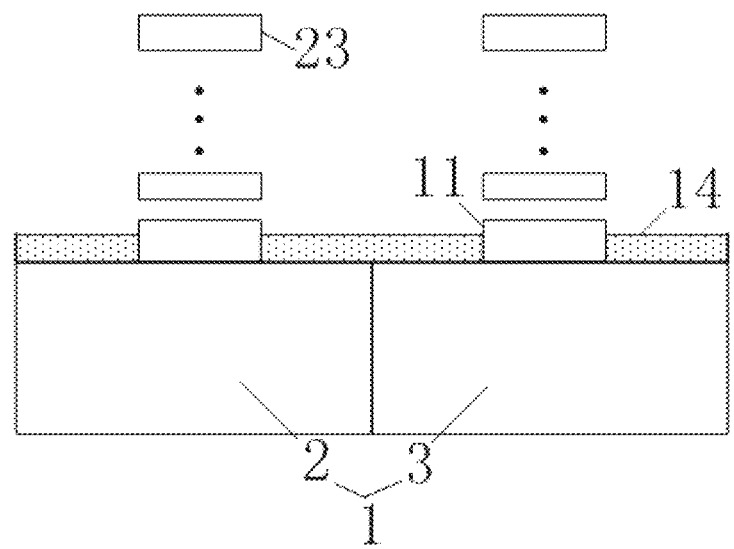

In step S36, as shown in FIG. 19, the sacrificial gate 15 is removed, and the hetero-material etching structure 12 in a gate region is removed, to form multiple layers of nanowires or nanosheets 23.

In step S36, the sacrificial gate 15 in the gate region may be removed through dry etching or wet etching process. After the sacrificial gate 15 is removed, a lamination including multiple hetero-material etching structures 12 and multiple second substrate etching structures 13 that are alternately laminated in the gate region is exposed. Then, the exposed hetero-material etching structures 12 may be removed in a high selectivity ratio, and the multiple second substrate etching structures 13 having different material from the hetero-material etching structure 12 are remained, thereby forming multiple layers of nanowires or nanosheets 23.

It is to be noted that, FIG. 19 is a cross-sectional view of a structure obtained after forming the multiple layers of nanowires or nanosheets 23 along the line A-A.

Figure 20:
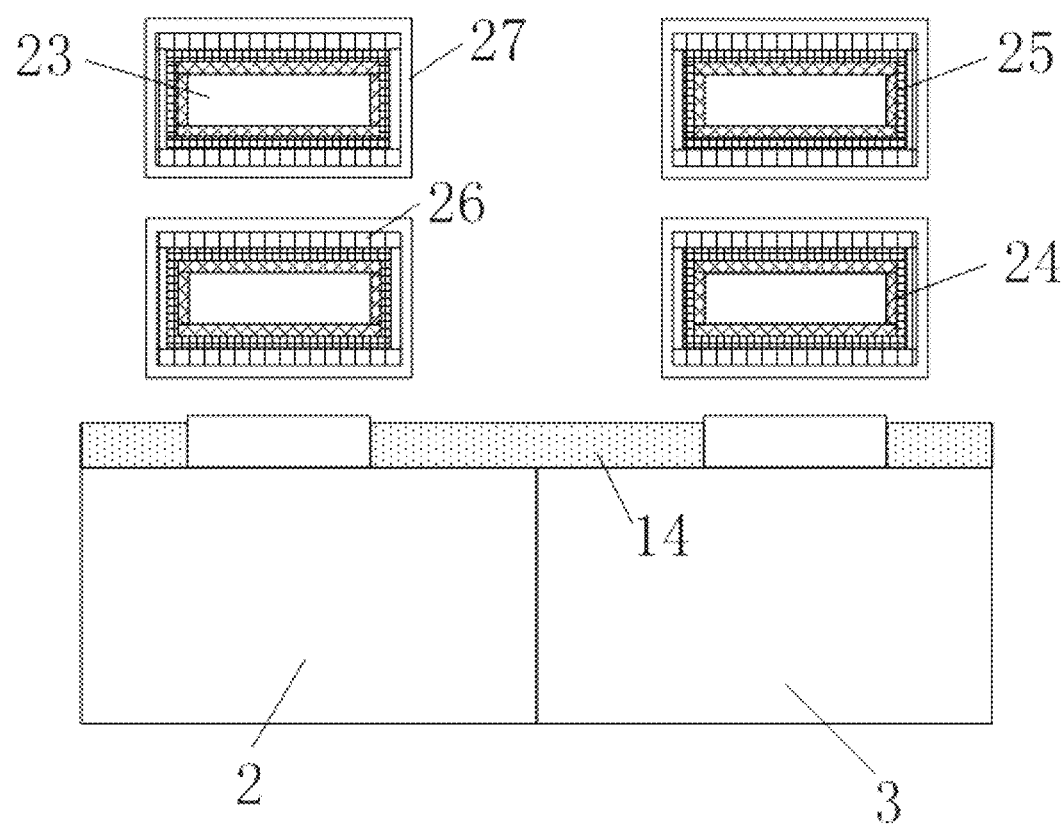
Figure 21:
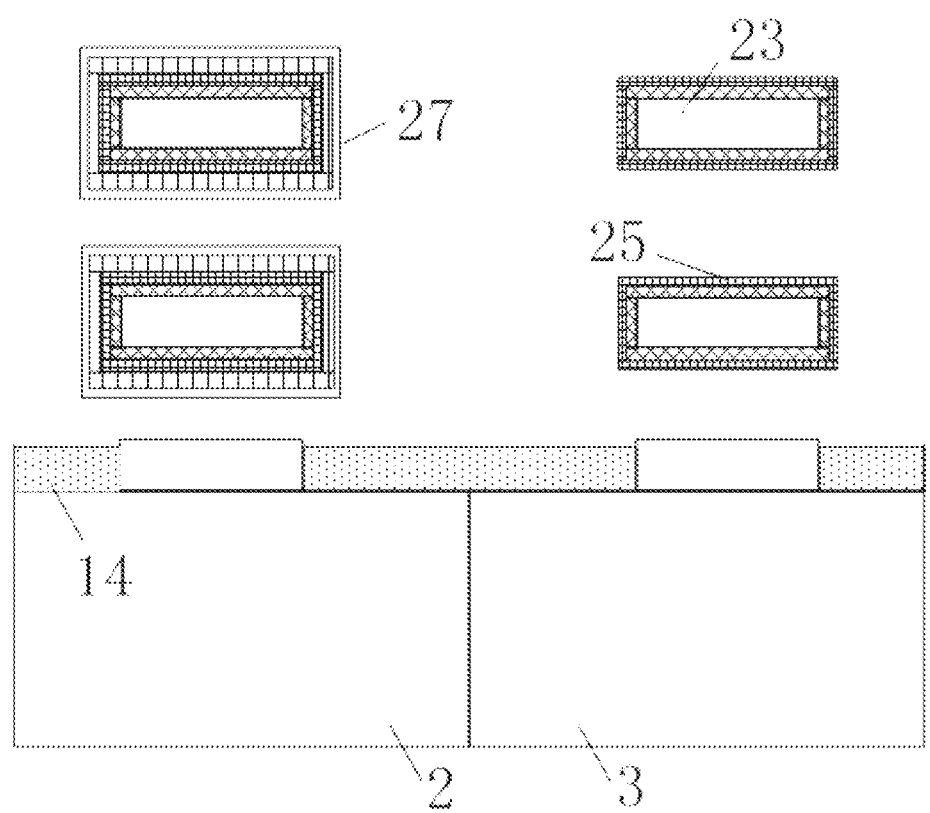
Figure 22:
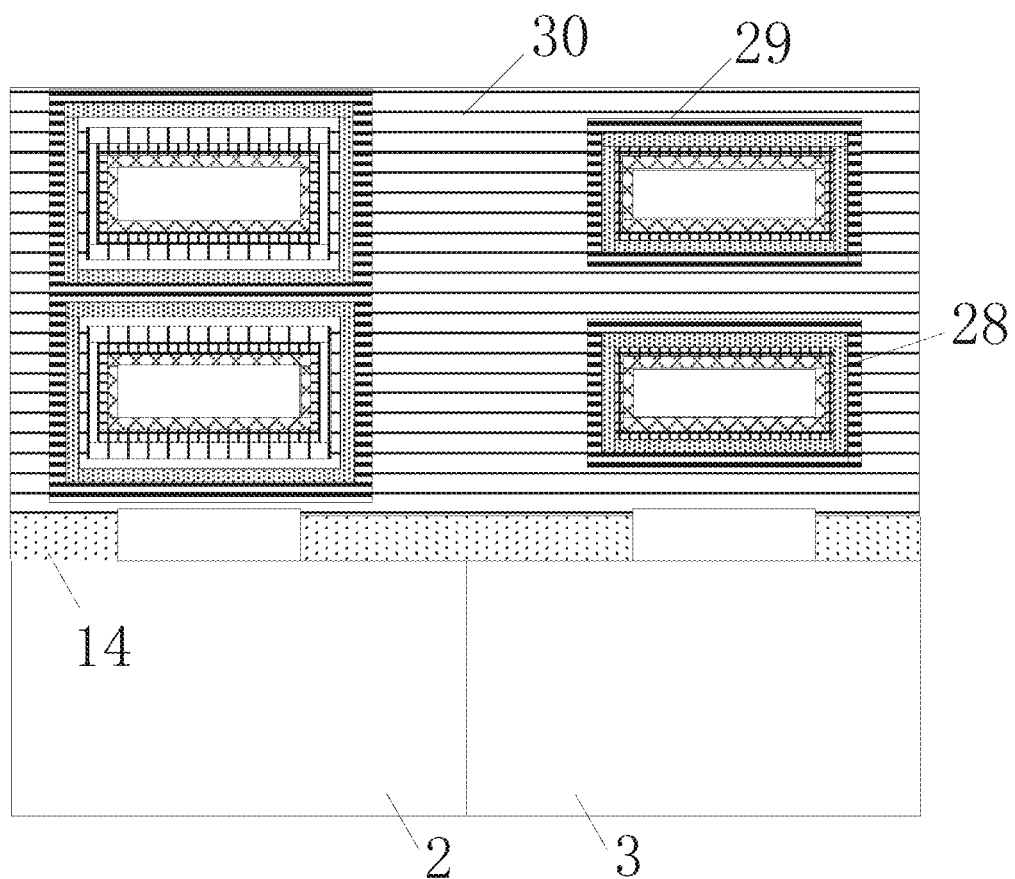

In step S4, as shown in FIG. 20 to FIG. 22, a gate dielectric layer 24 and a gate are formed on each nanowire or nanosheet 23.

Specifically, the forming the gate dielectric layer 24 and the gate on each nanowire or nanosheet 23 includes the following step S41 to S45.

In step S41, as shown in FIG. 20, a gate dielectric layer 24 is formed on the nanowire or nanosheet 23, and a first metal layer 25, a second metal layer 26 and a first metal gate layer 27 are sequentially formed on the gate dielectric layer 24 in each of the N-type-well region 2 and the P-type-well region 3.

In step S41, the gate dielectric layer 24 may be deposited on the nanowire or nanosheet 23 in the gate region through a process such as atomic layer deposition process. The first metal layer 25, the second metal layer 26 and the first metal gate layer 27 are sequentially formed on peripheral region of the gate dielectric layer 24.

Specifically, the gate dielectric layer 24 is a high dielectric constant layer. The high dielectric constant layer may be made of a material with a high dielectric constant such as $HfO_2$, $ZrO_2$, $TiO_2$ and $Al_2O_3$.

Specifically, the first metal layer 25 is made of TiN, and a thickness of the first metal layer 25 ranges from 0.1 nm to 5 nm. The second metal layer 26 is made of TaN, and a thickness of the second metal layer 26 ranges from 0.1 nm to 5 nm. The first metal gate layer is made of TiN or TiSiN, and a thickness of the first metal gate layer 27 ranges from 0.1 nm to 10 mn.

In step S42, as shown in FIG. 21, the first metal gate layer 27 and the second metal layer 26 on the gate dielectric layer 24 in the P-type-well region 3 are selectively removed, and the first metal layer 25 in the P-type-well region 3 is selectively removed by a predetermined thickness.

In step S42, a photoresist mask may be formed on the first metal gate layer 27 in the N-type-well region 2 through a photoetching process. Then, the first metal gate layer 27 and the second metal layer 26 formed on the gate dielectric layer 24 in the P-type-well region 3 are selectively removed through a process such as a dry etching process, and the first metal layer 25 in the P-type-well region 3 is selectively removed by a predetermined thickness, such that the first metal layer 25 having a certain thickness is only remained on the gate dielectric layer 24 in the P-type-well region 3. Before a next step is performed, it is required to remove the photoresist mask formed on the first metal gate layer 27 in the N-type-well region 2.

In step S43, the first metal gate layer 27 in the N-type-well region 2 is selectively removed by a predetermined thickness, and a second metal gate layer 28 is formed on each of the first metal gate layer 27 remaining on the N-type-well region 2 and the first metal layer 25 remaining on the P-type-well region 3.

In step S43, the photoresist mask may be formed on the first metal layer 25 remaining on the P-type-well region 3 through a photoetching process. Then, the first metal gate layer 27 on the N-type-well region 2 is selectively removed by a predetermined thickness through a process such as a dry etching process. The first metal layer 25, the second metal layer 26 and a first metal gate layer 27 having a certain thickness are sequentially remained on the gate dielectric layer 24 in the N-type-well region 2. Next, it is required to remove the photoresist mask formed on the first metal layer 25 remaining on the P-type-well region 3.

A second metal gate layer 28 is formed on each of the first metal gate layer 27 remaining on the N-type-well region 2 and the first metal layer 25 remaining on the P-type-well region 3. After the second metal gate layer 28 is formed, a first metal layer 25, a second metal layer 26, a first metal gate layer 27 having a certain thickness and a second metal gate layer 28 are sequentially formed on the gate dielectric layer 24 in the N-type-well region 2. A first metal layer 25 having a certain thickness and a second metal gate layer 28 are sequentially formed on the gate dielectric layer 24 in the P-type-well region 3.

Specifically, the second metal gate layer 28 is made of $TiAlC_y$. A thickness of the second metal gate layer 28 ranges from 0.1 nm to 10 nm. A value of y ranges from 0.1 to 0.9.

In step S44, a third metal layer 29 is formed on the second metal gate layer 28 in each of the N-type-well region 2 and the P-type-well region 3.

In step S44, the third metal layer 29 may be formed on the second metal gate layer 28 in each of the N-type-well region 2 and the P-type-well region 3 through a process such as an atomic layer deposition process. The third metal layer 29 is made of any one of W, Co and Al or any combination thereof. However, the third metal layer 29 may also be made of other materials meeting requirements. A thickness of the third metal layer 29 ranges from 1 nm to 500 nm.

In step S45, as shown in FIG. 22, a first metal 30 is deposited on the gate region and the first metal 30 is planarized. The first metal 30 is W. However, the first metal 30 may be other metal materials meeting requirements.

With the above technical solution, multiple metal layers made of different materials are formed on each of the gate dielectric layer 24 in the N-type-well region 2 and the P-type-well region 3, which can meet different requirements in performance of an N-type metal oxide semiconductor (NMOS) and a P-type metal oxide semiconductor (PMOS).

It is to be noted that, FIG. 20 to FIG. 22 are cross-sectional views each showing a corresponding structure along the line A-A.

In step S5, as shown in FIG. 23 to FIG. 26, a metal contact 37 is formed.

Specifically, the forming the metal contact 37 includes the following steps S51 to S55.

In step S51, a second oxide dielectric layer 31 is deposited, and the second oxide dielectric layer 31 is planarized.

Figure 23:
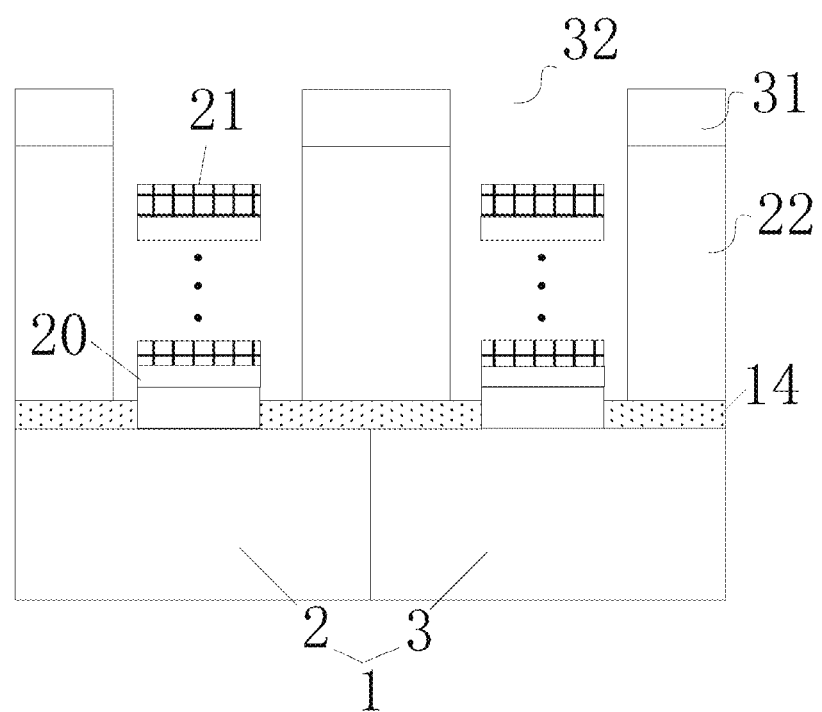

In step S52, as shown in FIG. 23, the second oxide dielectric layer 31 is etched to form contact holes 32 running downward from a top surface of the second oxide dielectric layer 31. The contact holes 32 correspond to the source-or-drain regions.

In step S53, silicide 34 is formed at a bottom of the contact holes 32, the silicide 34 contacts the source-or-drain regions.

Figure 24:
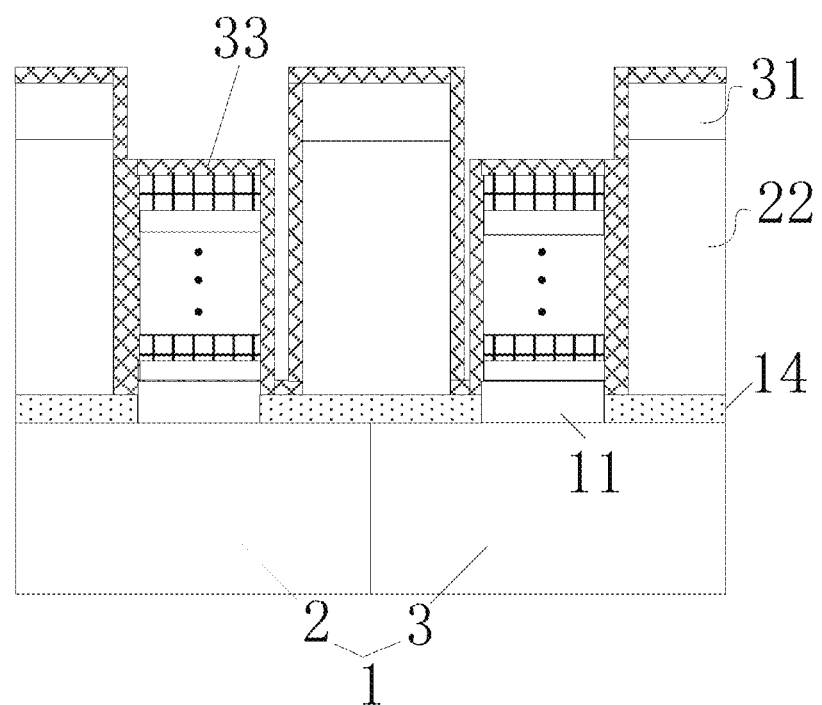

In step S53, as shown in FIG. 24, a fifth metal layer 33 may be deposited on a structure formed by the above steps, and a part of the fifth metal layer 33 outside the contact holes 32 is removed. A part of the fifth metal layer 33 inside the contact holes 32 contact surfaces of the source-or-drain regions and reacts to form the silicide 34, thereby reducing a contact resistance.

Specifically, the silicide 34 is any one of NiSi, $TiSi_2$ and $CoSi_2$. A thickness of the silicide 34 ranges from 0.1 nm to 100 nm.

Figure 25:
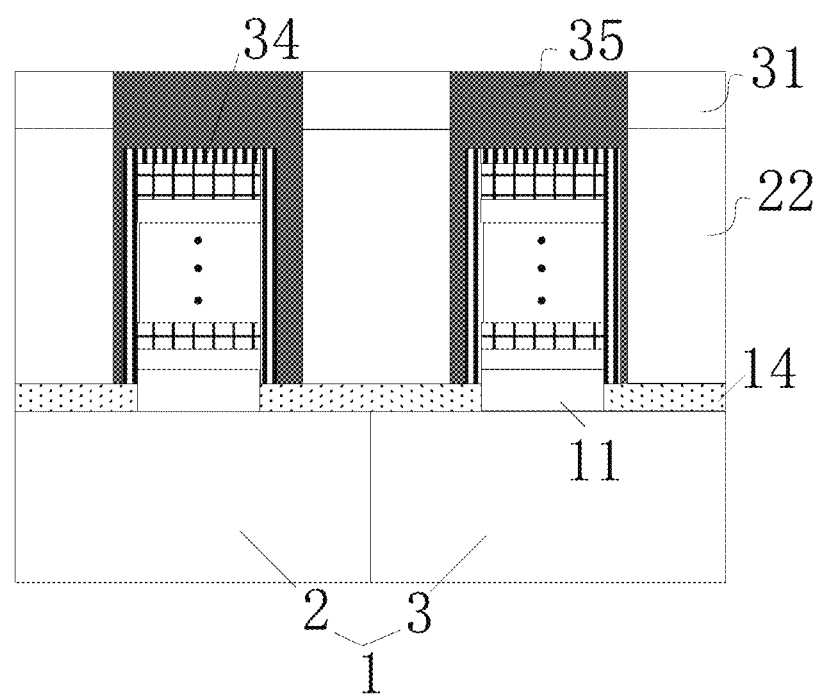

In step S54, as shown in FIG. 25, the contact holes 32 are filled with a second metal to form a first metal plug 35.

In step S54, after the silicide 34 is formed, the second metal is applied in the contact holes 32 and on the silicide 34 to form the metal plug 35. The second metal is Co or W.

Figure 26:
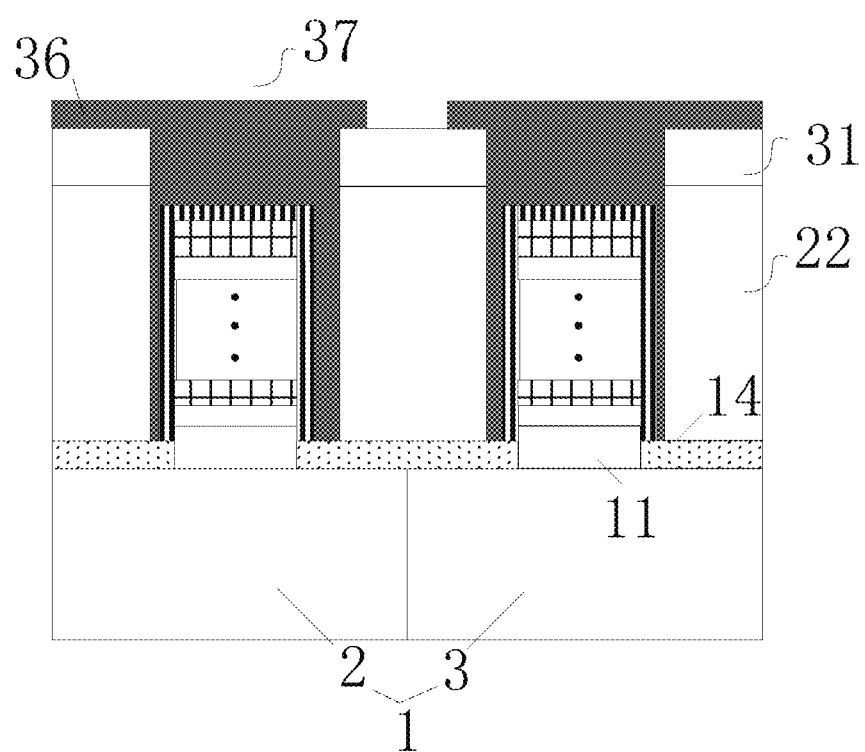

In step S55, as shown in FIG. 26, a fourth metal layer 36 is deposited, and a metal contact 37 is formed based on the fourth metal layer 36.

In step S55, the fourth metal layer 36 is deposited, and a part of the fourth metal layer 36 covering other region is removed through a photolithography process and an etching process, such that only a part of the fourth metal layer 36 covering a required region is remained, to form the metal contact 37.

The fourth metal layer 36 may be made of a metal material meeting requirements such as Co, W, Cu, Al, Ti, and Ni.

Figure 27:
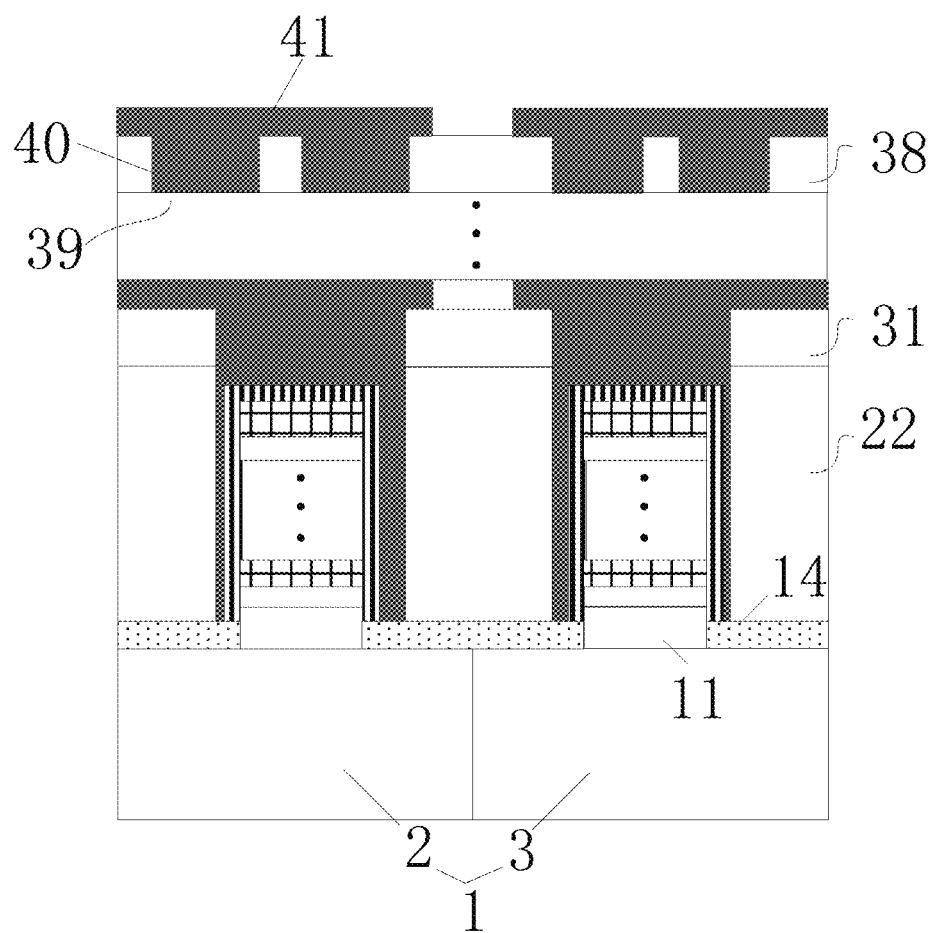

In step S6, as shown in FIG. 27, multiple layers of interconnection structures are formed on a formed structure.

The interconnection structure includes a third oxide dielectric layer 38, a through hole 39 formed by etching the third oxide dielectric layer 38, a second metal plug 40 filled in the through hole 39, and a metal line 41 connected to the second metal plug 40. Specifically, the number of layers of the interconnection structures may be determined according to actual needs.

Exemplary, multiple layers of interconnection structures made of copper are formed through a damascene process. With the damascene process, the through hole 39 is formed in the third oxide dielectric layer 38. Generally, the through hole 39 is formed through a conventional photolithography process and etching process. After the through hole 39 is formed, a material meeting requirements such as TiN or W is applied into the through hole 39 to form the second metal plug 40. Then, excess metal materials on a surface of the third oxide dielectric layer 38 are removed through a process such as a chemical mechanical polishing process. The metal line 41 connected to the second metal plug 40 is made of copper or other conductive materials.

Figure 28:
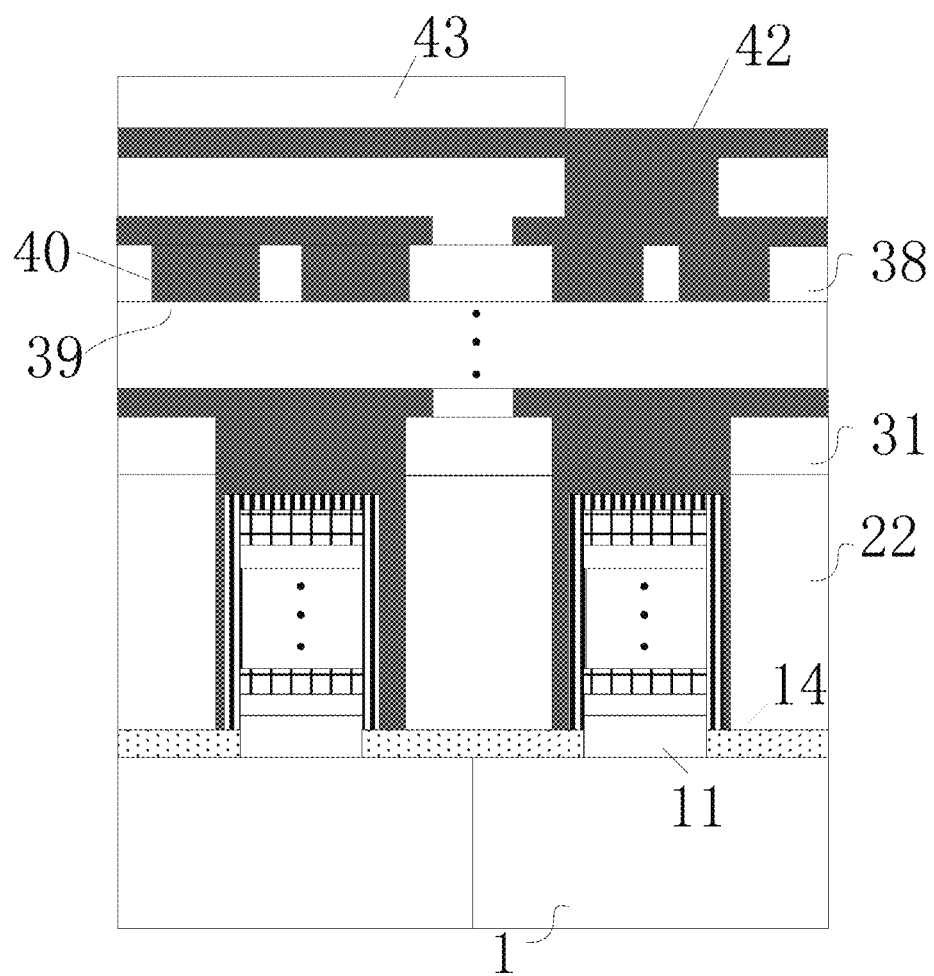

In step S7, as shown in FIG. 28, a metal pad 42 and a passivation layer 43 are sequentially formed on the multiple layers of interconnection structures.

In step S7, the metal pad 42 and the passivation layer 43 may be sequentially formed on the multiple layers of interconnection structures through a process such as a surface deposition process. Each of the metal pad 42 and the passivation layer 43 may be made of any material meeting requirements.

It is to be noted that, FIG. 23 to FIG. 28 are cross-sectional views each showing a corresponding structure along a line C-C.

A semiconductor device is further provided according to the present disclosure. The semiconductor device is manufactured with the method for manufacturing a semiconductor device according to the present disclosure.

In view of the above, with the method for manufacturing a semiconductor device according to the present disclosure, a single crystal lamination structure 7 including multiple hetero-material layers 8 and multiple channel material layers 9 that are alternately laminated is formed by forming the multiple hetero-material layers 8 and bonding each of the multiple hetero-material layers 9 to a corresponding second substrate 5. Compared with a conventional lamination structure 7 formed through epitaxial growth, a lattice defect in a channel can be avoided in the single crystal lamination structure 7, thereby ensuring a performance and a reliability of the subsequently formed semiconductor device.

The semiconductor device according to the present disclosure has the same good performance, high reliability, and good applicability.

The above description only shows preferred embodiments of the present disclosure and is not intend to limit the present disclosure. Those skilled in the art may make various modifications and variations to the present disclosure. Any modifications, equivalents, improvements, etc. made according to the spirit and principle of the present disclosure should fall within the protection scope of the present disclosure.

The invention claimed is:

1. A method for manufacturing a semiconductor device, comprising:
   providing a first substrate and at least one second substrate;
   forming a single crystal lamination structure on the first substrate, wherein the single crystal lamination structure comprises at least one hetero-material layer and at least one channel material layer that are alternately laminated, each of the at least one hetero-material layer is bonded to an adjacent one of the at least one channel material layer at a side away from the first substrate, and each of the at least one channel material layer is formed from one of the at least one second substrate;
   forming at least one layer of nanowire or nanosheet from the single crystal lamination structure; and
   forming a gate dielectric layer and a gate which surround each of the at least one layer of nanowire or nanosheet;
   wherein the first substrate comprise an N-type-well region and a P-type-well region, and the forming the gate dielectric layer and the gate that surround each of the at least one layer of nanowire or nanosheet comprises:
   forming a gate dielectric layer surrounding each of the at least one layer of nanowire or nanosheet;
   sequentially forming a first metal layer, a second metal layer and a first metal gate layer on the gate dielectric layer, in both the N-type-well region and the P-type-well region;
   removing the first metal gate layer and the second metal layer formed on the gate dielectric layer in the P-type-well region, and removing the first metal layer in the P-type-well region by a first predetermined thickness;
   removing the first metal gate layer in the N-type-well region by a second predetermined thickness;
   forming a second metal gate layer on each of the first metal gate layer remaining in the N-type-well region and on the first metal layer remaining in the P-type-well region;
   forming a third metal layer on the second metal gate layer in both the N-type-well region and the P-type-well region; and
   depositing a first metal in a gate region, and planarizing the first metal.

2. The method for manufacturing a semiconductor device according to claim 1, wherein the first substrate has a first bonding surface, and each of the at least one second substrate has a second bonding surface, the forming a single crystal lamination structure on the first substrate comprises steps of:
   forming one of the at least one hetero-material layer on the first bonding surface of the first substrate;
   bonding the surface of the one of the at least one hetero-material layer away from the first substrate to the second bonding surface of one of the at least one second substrate; and thinning the one of the at least one second substrate from a side away from the second bonding surface, to form one of the at least one channel material layer which has a predetermined thickness on the hetero-material layer.

3. The method for manufacturing a semiconductor device according to claim 2, wherein the single crystal lamination structure comprises a plurality of hetero-material layers and a plurality of channel material layers that are alternately laminated, and the forming a single crystal lamination structure on the first substrate further comprises steps of:
forming another of the at least one hetero-material layer on the one of the at least one channel material layer at a side away from the first substrate; and
repeating the bonding, the thinning, and the forming another of the at least one hetero-material layer, to form the plurality of hetero-material layers and the plurality of channel material layers.

4. The method for manufacturing a semiconductor device according to claim 1, wherein each of the first substrate and the at least one second substrate is a Si substrate, a SOI substrate, a GOI substrate, or a SiGe substrate.

5. The method for manufacturing a semiconductor device according to claim 1, wherein the hetero-material layer is made of $SiO_2$, $SiN_x$, or SiC, a thickness of the hetero-material layer ranges from 1 nm to 100 nm, wherein a value of x ranges from 0.1 to 0.9.

6. The method for manufacturing a semiconductor device according to claim 1, wherein the channel material layer is made of Si, Ge, or SiGe, and a thickness of the channel material layer ranges from 1 nm to 100 nm.

7. The method for manufacturing a semiconductor device according to claim 1, wherein the hetero-material layer is bonded to the second bonding surface through silicon-to-silicon direct bonding, metal surface bonding, polymer adhesive layer bonding, or eutectic bonding process.

8. The method for manufacturing a semiconductor device according to claim 1, wherein
the first metal layer is made of TiN, and a thickness of the first metal layer ranges from 0.1 nm to 5 nm;
the second metal layer is made of TaN, and a thickness of the second metal layer ranges from 0.1 nm to 5 nm; and
the first metal gate layer is made of TiN or TiSiN, and a thickness of the first metal gate layer ranges from 0.1 nm to 10 nm.

9. The method for manufacturing a semiconductor device according to claim 8, wherein
the second metal gate layer is made of $TiAlC_y$, and a thickness of the second metal gate layer ranges from 0.1 nm to 10 nm, wherein a value of y ranges from 0.1 to 0.9;
the third metal layer is made of one or a combination of W, Co and Al, and a thickness of the third metal layer ranges from 1 nm to 500 nm; and
the first metal is W.

10. A semiconductor device, wherein the semiconductor device is manufactured with the method according to claim 1.

11. A method for manufacturing a semiconductor device, comprising,
providing a first substrate and at least one second substrate;
forming a single crystal lamination structure on the first substrate, wherein the single crystal lamination structure comprises at least on hetero-material layer and at least one channel material layer that are alternately laminated, each of the at least on hetero-material layer is bonded to an adjacent one of the least one channel material layer at a side away from the first substrate, and each of the at least one channel material layer is formed from one of the at least one second substrate;
forming at least one layer of nanowire or nanosheet from the crystal lamination structure; and
forming a gate dielectric layer and a gate which surround each of the at least one layer of nanowire or nanosheet;
wherein the forming the at least one layer of nanowire or nanosheet from the single crystal lamination structure comprises:
etching the single crystal lamination structure and the first substrate to form a plurality of fin structures extending along a first direction on the first substrate, wherein the plurality of fin structures comprises the etched single crystal lamination structure and a part of the etched first substrate;
forming a shallow trench isolation in a trench between adjacent fin structures;
forming a sacrificial gate extending along a second direction on the plurality of fin structures;
forming source-or-drain regions through doping and thermal annealing, wherein the source-or-drain regions are located at two sides of the sacrificial gate along the first direction;
depositing a first oxide dielectric layer, and planarizing the first oxide dielectric layer to expose a top of the sacrificial gate; and
removing the sacrificial gate, to expose the lamination structure in a gate region; and
removing the hetero-material layer in the gate region to form the at least one layer of nanowire or nanosheet.

12. The method for manufacturing a semiconductor device according to claim 11, wherein after forming the sacrificial gate and before forming the source-or-drain regions, the method further comprises:
removing the plurality of fin structures at the two sides of the sacrificial gate by a predetermined length;
removing the at least one hetero-material layer outside the gate region, to form cavities;
forming inner sidewalls in the cavities;
forming spacers on the two sides of the sacrificial gate along the first direction, wherein the spacers are located adjacent to the sacrificial gate and on the plurality of fin structures; and
forming one or more fins at the two sides of the plurality of fin structures, wherein
the forming source-or-drain regions through doping and thermal annealing comprises:
doping and annealing the one or more fins to form the source-or-drain regions.

13. The method for manufacturing a semiconductor device according to claim 12, wherein the forming inner sidewalls in the cavities comprises:
forming a material layer covering the plurality of fin structures; and
removing the material layer outside the cavities.

14. The method for manufacturing a semiconductor device according to claim 12, wherein each of the one or more fins comprises at least one first material layer and at least one second material layer that are alternately laminated, wherein the at least one first material layer and the at least one second material layer correspond to the at least one hetero-material layer and the at least one channel material layer, respectively, in locations.

15. A semiconductor device, wherein the semiconductor device is manufactured with the method according to claim 11.

16. A method for manufacturing a semiconductor device, comprising:
forming a single crystal lamination structure on the first substrate, wherein the single crystal lamination structure comprises at least one hetero-material layer and at least one channel material layer that are alternately laminated, each of the least one hetero-material layer is bonded to an adjacent one of the at least one channel material layer at a side away from the first substrate, and each of the least one channel material layer is formed from one of the at least one second substrate;
forming at least one layer of nanowire or nanosheet from the single crystal lamination structure; and
forming a gate dielectric layer and a gate which surround each of the least one layer of nanowire or nanosheet;
wherein the method further comprises:
depositing a second oxide dielectric layer, and planarizing the second oxide dielectric layer;
etching the second oxide dielectric layer to form contact holes running downward from a top surface of the second oxide dielectric layer, wherein the contact holes correspond to the source-or-drain regions;
forming silicide at a bottom of the contact holes, where the silicide contacts the source-or-drain regions;
filling the contact holes with a second metal to form a first metal plug; and
depositing a fourth metal layer, wherein the fourth metal layer is configured to form a metal contact.

17. The method for manufacturing a semiconductor device according to claim 16, wherein the silicide is any one of NiSi, $TiSi_2$, or $CoSi_2$, a thickness of the silicide ranges from 0.1 nm to 100 nm, and the second metal is Co or W.

18. The method for manufacturing a semiconductor device according to claim 16, further comprising:
forming at least one layer of an interconnection structure on the metal contact, wherein
each of the at least one layer of the interconnection structure comprises:
a third oxide dielectric layer;
a through hole formed by etching the third oxide dielectric layer;
a second metal plug filled in the through hole; and
a metal line connected to the second metal plug.

19. The method for manufacturing a semiconductor device according to claim 18, further comprising:
sequentially forming a metal pad and a passivation layer on the at least one layer of the interconnection structure.

20. A semiconductor device, wherein the semiconductor device is manufactured with the method according to claim 16.

* * * * *